United States Patent [19]

Mead et al.

[11] Patent Number: 4,962,342

[45] Date of Patent: Oct. 9, 1990

[54] DYNAMIC SYNAPSE FOR NEURAL NETWORK

[75] Inventors: Carver A. Mead, Pasadena; Timothy P. Allen, Palo Alto; Federico Faggin, Los Altos Hills, all of Calif.

[73] Assignee: Synaptics, Inc., San Jose, Calif.

[21] Appl. No.: 347,837

[22] Filed: May 4, 1989

[51] Int. Cl.[5] ................. G11C 27/02; G11C 7/00; H03K 19/094; H03K 19/177

[52] U.S. Cl. .................... 307/201; 307/493; 307/469; 307/530; 365/189.04; 365/189.05; 365/220

[58] Field of Search ............. 307/201, 530, 279, 493, 307/494, 469, 496, 497, 500; 365/177, 220, 221, 189.01, 189.04, 189.05, 189.08, 189.09

[56] References Cited

U.S. PATENT DOCUMENTS

| | | | |
|---|---|---|---|
| 4,719,596 | 1/1988 | Bernstein et al. | 365/189.04 |
| 4,771,196 | 9/1988 | Mead et al. | 307/493 X |
| 4,831,591 | 5/1989 | Imazeki et al. | 365/189.08 |
| 4,904,881 | 2/1990 | Castro | 307/201 |
| 4,904,888 | 2/1990 | Yamauchi et al. | 307/530 |
| 4,906,865 | 3/1990 | Holler | 307/201 X |

*Primary Examiner*—Stanley D. Miller
*Assistant Examiner*—David R. Bertelson
*Attorney, Agent, or Firm*—Lyon & Lyon

[57] ABSTRACT

An electronic circuit is disclosed having a sample/hold amplifier connected to an adaptive amplifier. A plurality of such electronic circuits may be configured in an array of rows and columns. An input voltage vector may be compared with an analog voltage vector stored in a row or column of the array and the stored vector closest to the applied input vector may be identified and further processed. The stored analog value may be read out of the synapse by applying a voltage to a read line. An array of the readable synapses may be provided and used in conjunction with a dummy synapse to compensate for an error offset introduced by the operating characteristics of the synapses.

16 Claims, 3 Drawing Sheets

DYNAMIC SYNAPSE FOR NEURAL NETWORK RELATED APPLICATIONS

The present application is related to co-pending application Ser. No. 332,490, filed Mar. 10, 1989, entitled Synaptic Element and Array, and assigned to the same assignee as the present invention. This co-pending application is expressly incorporated herein by reference.

BACKGROUND OF THE INVENTION

1. Field of the Invention

The present invention relates to artificial neural networks, and more specifically relates to a dynamic synapse for an artificial neural network.

2. The Prior Art

Several schemes for using a matrix of electronic devices for neuron network applications have been proposed. To date, all such schemes involve using "weights" to control the amount of current injected into an electrical node "neuron". These weights are set by controlling the value of a resistor or the saturation current of a transistor. The limitation of any such scheme is that the value of any parameter of an electronic device in an integrated circuit is not well controlled. For example, the saturation currents of two MOS transistors of the same size can be different by a factor of 2 if these devices are operated in the sub-threshold regime. The "training" mechanism that adjusts the weights must take these uncertainties into account by iterating and testing the outcome of the weight-adjustment process. It is therefore desireable that an adaptive mechanism be found whereby the matrix element adjusts itself to any uncertainty in device parameters, as part of the training process.

BRIEF DESCRIPTION OF THE INVENTION

In a first embodiment of the present invention, a CMOS inverter acts as an associative element or "synapse". An input capacitor is connected between the input of the inverter and an input line. An adapt transistor is connected between the inverter output and the inverter input.

An array of these synapses can be used to perform a closest match in many dimensions. According to another aspect of the present invention, an m by n array of synapses contains m rows and n columns of synapses. A voltage input line for each of the m rows is connected to one end of the input capacitor of each synapse in the row with which it is associated. A write line for each of the n columns is connected to the input of the adapt transistor of each synapse in the column with which it is associated. The positive power supply node of the inverter in each synapse in a column is connected to a sense line associated with that column.

In a another embodiment of the present invention, a dynamic synapse includes a CMOS inverter which acts as an associative element. An input capacitor is connected between the input of the inverter and an input/output line. An adapt transistor is connected between the inverter output and the inverter input. A read transistor connected to the inverter output allows the analog value stored in the synapse to be read out to the input/output line.

An array of these readable synapses can be used to perform a closest match in many dimensions. In yet another aspect of the present invention, an m by n array of synapses contains m rows and n columns of synapses. An input/output line for each of the m rows is connected to one end of the input capacitor of each synapse in the row with which it is associated. A write line for each of the n columns is connected to the input of the adapt transistor of each synapse in the column with which it is associated. The positive power supply node of the inverter in each synapse in a column is connected to a sense line with which that column is associated. A read line for each of the n columns is connected to the gate of an MOS read transistor in each synapse associated with that column. The read transistor is connected between the input/output line of the row containing the synapse with which it is associated and the output node of the inverter within that synapse.

In another aspect of the invention, a dummy synapse is used to generate a correction voltage to compensate for a voltage error created by charge transfer associated with the adapt transistor.

DETAILED DESCRIPTION OF A PREFERRED EMBODIMENT

In co-pending application Ser. No. 322,490, an analog synapse is described wherein an analog value may be permanently stored and later compared with an input value. An array of these synapses, together with input and output circuitry, can be used as a classifier, vector quantizer, or analog associative memory.

In order to program the analog values into an array of synapses, the values to be stored in each column are presented, and a adapt line for the particular column is activated, thereby storing the values in a temporary analog memory in the form of a sample/hold circuit. The values thus temporarily stored are refreshed while the chip is exposed to ultraviolet light. Once the analog values have stabilized, the ultraviolet light is removed, and the chip can be used as a stand-alone device. No additional off-chip store of the analog values is required.

The technology described in co-pending application serial No. 322,490 is ideal for applications where the desired values do not change after the system is configured. There are, however, applications in which the analog values stored in each synapse must be changed as the computation progresses. An example of such an application is a learning algorithm, in which associations are computed by an array of synapses, and the values stored in a number of these synapses are modified as a result of that association.

In such an application, the analog values may be stored in a host computer and may be available for use by the system at any time, independent of the values stored in the synapses in the associative array. In such circumstances, a simplification of the synapses is possible. This simplification is the subject of the present invention.

Figure 1:
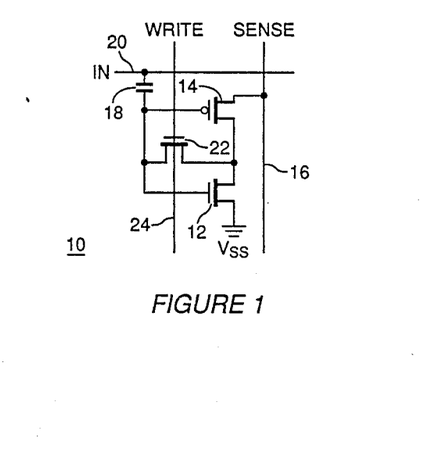
FIG. 1 is a schematic diagram of a dynamic synapse according to a presently preferred embodiment of the present invention.

Referring first to FIG. 1, a synapse 10 according to a presently preferred embodiment of the present invention includes an inverter having an N-channel MOS transistor 12 with its source connected to a source of negative voltage Vss (shown in FIG. 1 as ground), its drain connected to the drain of a P-channel MOS transistor 14, and its gate connected to the gate of P-channel MOS transistor 14. The source of P-channel MOS transistor 14 is a the positive power supply node for the inverter and may be connected to a current sense line 16. Those of ordinary skill in the art will readily recognize that the source of N-channel MOS transistor 12 could be the output current sense node of the inverter, in which case the source of P-channel MOS transistor 14 would be connected to a source of positive voltage.

An input capacitor 18 has one of its plates connected to the common connection of the gates of MOS transistors 12 and 14, the input node of the inverter, and the other one of its plates connected to a voltage input line 20. An MOS adapt transistor 22 has its source connected to the common connection of the drains of MOS transistors 12 and 14 (the output node of the inverter), its drain connected to the common connection of the gates of MOS transistors 12 and 14 (the input node of the inverter), and its gate connected to a write line 24.

As described in co-pending application serial No. 322,490, there is a particular input voltage Vinv to the CMOS inverter including MOS transistors 12 and 14 at which the inverter output voltage is also equal to Vinv. With this voltage Vinv applied to its input, the inverter will draw maximum current from its sense line 16.

When the input on write line 24 to the adapt transistor 22 is high, adapt transistor 22 is conducting and the inverter will automatically adjust itself to this high current condition. If a voltage V is placed on input line 20 connected to one end of input capacitor 18 when the write line 24 to the adapt transistor is high, a voltage V−Vinv will be impressed across input capacitor 18.

If the voltage on write line 24 is then reduced to zero, the charge C(V−Vinv) plus a small error charge due to the turning off of the adapt transistor 22 will be stored on the input capacitor. The stored charge will decay only very slowly at a rate set by the very small leakage current from the inverter input node. Typical rates of discharge measured on such nodes formed using a clean CMOS process are approximately 5–10 mV/sec at room temperature. For a typical accuracy of 10 mV, the charge on the input capacitor will need to be refreshed once every second.

Between refresh operations, the synapse can be used to perform an associative operation, just as the synapse described in co-pending application serial No. 322,490. An unknown voltage is placed on the input line 20, and the current on the sense line 16 acts as a closeness metric, being maximum when the unknown voltage is equal to V, and decreasing monotonically with the error (unsigned difference between the unknown voltage and V).

Figure 2:
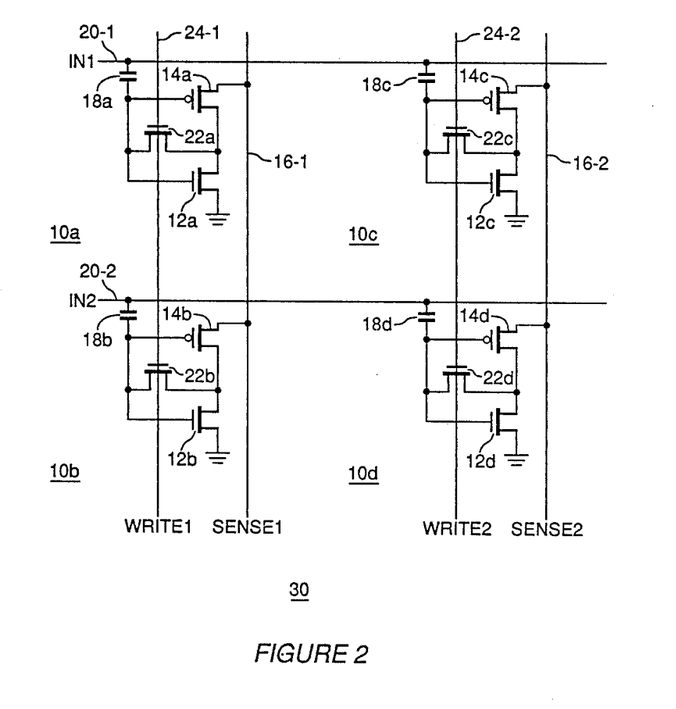
FIG. 2 is a schematic diagram of an array of synapses according to a presently preferred embodiment of the present invention.

Referring now to FIG. 2, a 2 by 2 array 30 of synapses of FIG. 1 is shown. While the embodiment of FIG. 2 illustrates a 2 by 2 array, those of ordinary skill in the art will readily recognize that an array of any size may be built according to the teachings of the present invention, limited only by the constraints of integrated circuit fabrication technology.

In the embodiment of FIG. 2, voltage input line 20-1 is associated with the first row of array 30 and voltage input line 20-2 is associated with the second row of array 30. Similarly, write line 24-1 is associated with the first column of the array, write line 24-2 is associated with the second column of the array, sense line 16-1 is associated with the first column of the array and sense line 16-2 is associated with the second column of the array.

There are two synapses 10a and 10b in the first column of the array, and two synapses 10c and 10d in the second column of the array. The components of each synapse in the array are given the same reference numerals as they were given in FIG. 1, except that the letters a, b, c, and d are assigned to them to designate the array position of the synapse of which they are a part.

The array of FIG. 2 is adapted one column at a time. To adapt the first column, the desired voltages are placed on input lines 20-1 and 20-2 and write line 24-1 is brought high, kept there for a time sufficient to allow the voltages in the circuit to stabilize and then brought low again. To adapt the second column, the procedure is repeated, except that write line 24-2 is used.

To associate the adapted array, input voltages are placed on input lines 20-1 and 20-2 and the currents flowing on the desired sense lines 16-1 and 16-2 are sensed. Preprocessing and post processing of the signals on those lines may be accomplished as disclosed in co-pending application serial No. 322,490.

In some applications, the voltages on the capacitors in the array will be evolved under some learning algorithm, and will not be available in digital form. Since it is desireable to read these stored values directly from the array, a small addition to the synapse of FIG. 1 is required to achieve this analog read capability. A presently preferred embodiment of a readable synapse is shown in FIG. 3.

Figure 3:
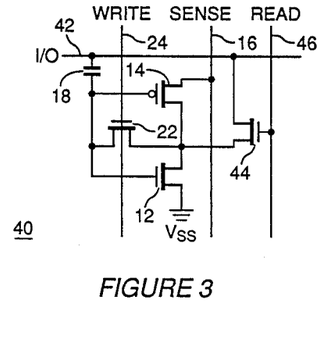
FIG. 3 is a preferred embodiment of a readable synapse for use with the present invention.

Referring now to FIG. 3, a readable synapse 40 includes an inverter having an N-channel MOS transistor 12 with its source connected to a source of negative voltage Vss (shown in FIG. 3 as ground), its drain connected to the drain of a P-channel MOS transistor 14, and its gate connected to the gate of P-channel MOS transistor 14. The source of P-channel MOS transistor 14 is the positive power supply node for the inverter and may be connected to a current sense line 16. Those of ordinary skill in the art will readily recognize that the source of N-channel MOS transistor 12 could be the output current sense node of the inverter, in which case the source of P-channel MOS transistor 14 would be connected to a source of positive voltage.

An input capacitor 18 has one of its plates connected to the common connection of the gates of MOS transistors 12 and 14, the input node of the inverter, and the other one of its plates connected to an input/output line 42. An MOS adapt transistor 22 has its source connected to the common connection of the drains of MOS transistors 12 and 14 (the output of the inverter), its drain connected to the common connection of the gates of MOS transistors 12 and 14 (the input of the inverter), and its gate connected to a write line 24.

Thus far, the synapse described with reference to FIG. 3 is identical to the one described with reference to FIG. 1. The synapse of FIG. 3 additionally includes a read transistor 44, having its source connected to the output of the inverter (the common connection of the drains of MOS transistors 12, 14, and 22), its drain connected to input/output line 42, and its gate connected to read line 46. Read transistor 44 is shown in FIG. 3 as an N-channel MOS transistor, but those of ordinary skill in the art will recognize that it could also be a P-channel transistor. It is presently preferred that read transistor 44 have the same channel type as the wells used in the CMOS process to fabricate the present invention.

The addition of MOS read transistor 44 allows the output of the inverter to be placed on the input/output line by raising the voltage on the read line 46. Charge is stored on the input capacitor 18 in exactly the same manner as described with reference to FIG. 1 with read line 46 held low.

When it is desired to read the value of the analog data on the synapse, any line drivers driving input/output line 46 must be disabled, i.e., by placing them in a high impedance output state as is well known in the art, before raising the voltage on read line 46 to connect the output of the inverter to input/output line 42. In this condition, the gain of the inverter acts to drive the input of the inverter to a voltage very nearly equal to V.

In an array of such synapses, each read line will be associated with a column of the array and thus all values in a column can be read or written at once. Such an array is shown in FIG. 4.

Figure 4:
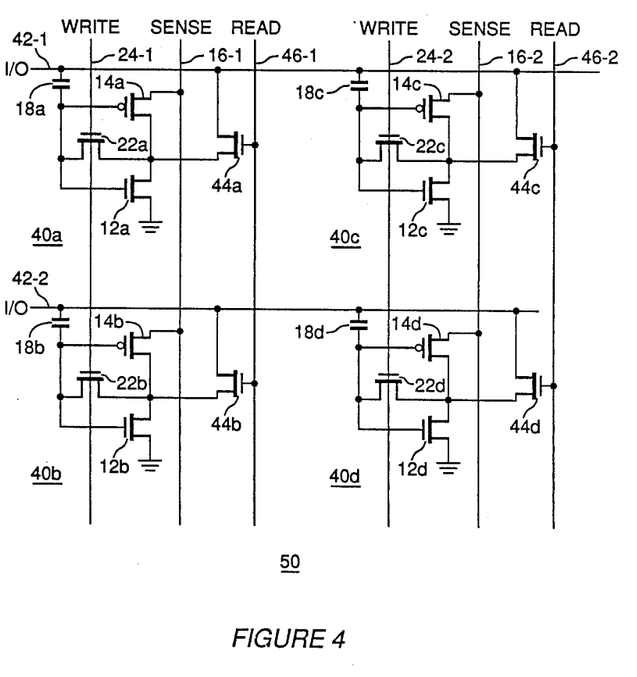
FIG. 4 is a schematic diagram of an array of synapses according to a preferred embodiment of the present invention having analog read capability.

Referring now to FIG. 4, a 2 by 2 array 50 of synapses of FIG. 3 is shown. While the embodiment of FIG. 4 illustrates a 2 by 2 array, those of ordinary skill in the art will readily recognize that an array of any size may be built according to the teachings of the present invention, limited only by the constraints of integrated circuit fabrication technology.

In the embodiment of FIG. 4, input/output line 42-1 is associated with the first row of array 50 and input/output line 42-2 is associated with the second row of array 50. Similarly, write line 24- is associated with the first column of the array, write line 24-2 is associated with the second column of the array, sense line 16-1 is associated with the first column of the array, sense line 16-2 is associated with the second column of the array, read line 46-1 is associated with the first column of the array, and read line 46-2 is associated with the second column of the array.

There are two synapses 40a and 40b in the first column of the array, and two synapses 40c and 40d in the second column of the array. The components of each synapse in the array are given the same reference numerals as they were given in FIG. 3, except that the letters a, b, c, and d are assigned to them to designate the array position of the synapse of which they are a part.

The array of FIG. 4 is adapted one column at a time. To adapt the first column, the desired voltages are placed on input lines 42-1 and 42-2 and write line 24-1 is brought high, kept there for a time sufficient to allow the voltages in the circuit to stabilize and then brought low again. To adapt the second column, the procedure is repeated, except that write line 24-2 is used.

To associate the adapted array, input voltages are placed on input lines 42-1 and 42-2 and the currents flowing on the desired sense lines 16-1 and 16-2 are sensed. To read the array, the input drivers driving input/output lines 42-1 and 42-2 are disabled and their outputs placed in a high impedance state and then the read lines 46-1 and 46-2 are brought high one at a time, thus reading out the analog stored values column by column.

As previously mentioned, the charge present in the channel of adapt transistor 22 when its gate is at a high voltage will be ejected into its source an drain when its gate is taken low. Because its source and drain will be at the same potential during a write operation, approximately half of the channel charge will be ejected into the input/output line and the other half will be stored as an error charge on the inverter input node. In order for the voltage at which the inverter current peaks during an association operation to be the same as an input voltage present during a write operation, the voltage to which the input line is driven during a write should be reduced by an amount exactly equal to the decrement occurring in the synapse when write line 24 goes low.

The correction is greatly facilitated by the fact that, during the write operation, the inverter input node is always held at inverter voltage Vinv, independent of the particular input voltage V. One way that such a correcting voltage may be generated is by using a dummy synapse in each row of an array of synapses. The characteristics of the dummy synapse are matched to those of the synapses in the array. Such a dummy synapse, and its use in the present invention, is shown with reference to FIG. 5.

Figure 5:
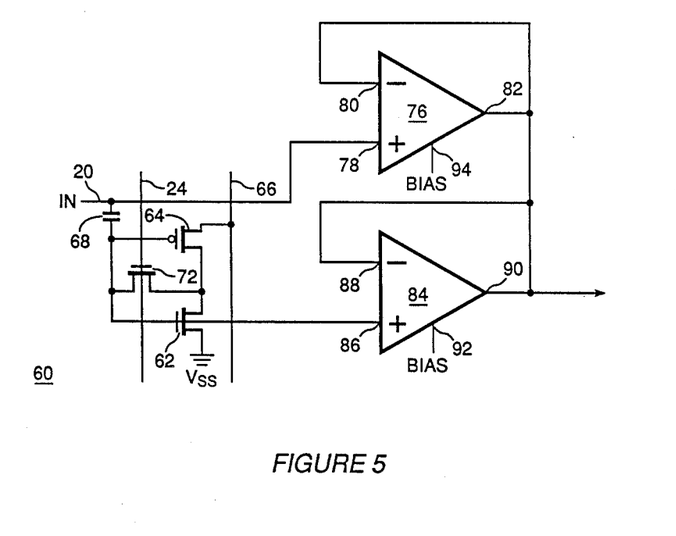
FIG. 5 shows the structure and use of a dummy synapse to correct for the error charge stored as a result of the inherent characteristics of MOS transistor operation.

Referring now to FIG. 5, a dummy synapse 60 according to a presently preferred embodiment of the present invention includes an inverter having an N-channel MOS transistor 62 with its source connected to a source of negative voltage Vss (shown in FIG. 5 as ground), its drain connected to the drain of a P-channel MOS transistor 64, and its gate connected to the gate of P-channel MOS transistor 64. The source of P-channel MOS transistor 14 is the positive power supply node for the inverter and should be the same as the power supply for the synapse in the array.

An input capacitor 68 has one of its plates connected to the common connection of the gates of MOS transistors 62 and 64, the input node of the inverter, and the other one of its plates connected to a voltage input line 70. An N-channel MOS adapt transistor 72 has its source connected to the common connection of the drains of MOS transistors 62 and 64 (the output node of the inverter), its drain connected to the common connection of the gates of MOS transistors 62 and 64 (the input node of the inverter), and its gate connected to a write line 74.

A first amplifier 76, connected as a follower, has its non-inverting input 78 connected to voltage input line 70, and its inverting input 80 connected to its output 82. A second amplifier 84 has its non-inverting input 86 connected to the node consisting of one plate of capacitor 68, the drain of adapt transistor 72 and the gates of N-channel MOS transistor 62 and P-channel MOS transistor 64, and its inverting input 88 connected to its output 90. The outputs 82 and 90 of amplifiers 76 and 84 are connected together to the row input line 20 or input/output line 46 of an array of synapses. Amplifiers 76 and 84 may be the transconductance amplifiers disclosed in co-pending application serial No. 282,176, filed Mar. 2, 1989, entitled Subthreshold CMOS Amplifier With Offset Adaptation, assigned to the same assignee as the present invention. This application is expressly incorporated herein by reference.

Those of ordinary skill in the art will recognize that dummy synapse 60 will have to be made somewhat larger than the rest of the synapses in the array with which it is used. More particularly, care must be taken to assure that the ratio of the capacitance of capacitor 68 and the capacitances coupling the input node of the inverter to other nodes in the circuit are matched to the ratios of the synapses in the array.

To adapt dummy synapse 60, its write line 74 is brought high and then low again in the same manner as if adapting a synapse as taught herein. To perform a write operation, the bias input 92 of amplifier 84 is brought to a voltage which will put the corrected voltage output of the dummy synapse on to the row line to which the output 90 of amplifier 84 is connected. The synapse in the desired column may then be written using this corrected voltage. Thereafter, the current through the synaptic element 40x will peak when the uncorrected voltage V is present at the input/output line 42 of the synapse connected to the row line.

To perform an associate operation, the input voltage is placed on input line 70, and a voltage is placed on bias input 94 of amplifier 76 in order to place that uncorrected input voltage onto the row input line of the array with which the dummy synapse is associated. Thus the array performs associations in real time with no intermediate clocking operations.

While preferred embodiments of the present invention have been disclosed herein, those of ordinary skill in the art will be able to envision other embodiments from the teachings herein. The present invention is therefore limited only by the scope of the appended claims.

What is claimed is:

1. An adaptive amplifier, including:
   an input node,
   an inverter including a P-channel MOS inverter transistor and an N-channel MOS inverter transistor, said P-channel MOS inverter transistor having its source connected to an output current sense node, its drain connected to the drain of said N-channel MOS inverter transistor, and a gate connected to the gate of said N-channel MOS inverter transistor, the source of said N-channel MOS inverter transistor connected to a source of negative voltage,
   a capacitor connected between said input node and the gates of said P-channel and N-channel MOS inverter transistors, and
   an MOS adapt transistor, having its drain connected to the gates of said P-channel and N-channel inverter transistors, its source connected to the drains of said P-channel and N-channel inverter transistors, and its gate connected to an adapt node.

2. The adaptive amplifier of claim 1 wherein said MOS adapt transistor is an N-channel MOS transistor.

3. An adaptive amplifier, including:
   an input/output node,
   an inverter including a P-channel MOS inverter transistor and an N-channel MOS inverter transistor, said P-channel MOS inverter transistor having its source connected to an output current sense node, its drain connected to the drain of said N-channel MOS inverter transistor, and a gate connected to the gate of said N-channel MOS inverter transistor, the source of said N-channel MOS inverter transistor connected to a source of negative voltage,
   a capacitor connected between said input/output node and the gates of said P-channel and N-channel MOS inverter transistors,
   an MOS adapt transistor, having its drain connected to the gates of said P-channel and N-channel inverter transistors, its source connected to the drains of said P-channel and N-channel inverter transistors, and its gate connected to an adapt node, and
   a MOS read transistor, having its drain connected to the drains of said P-channel and N-channel inverter transistors, its source connected to said input/output node, and its gate connected to a read node.

4. The adaptive amplifier of claim 3 wherein said MOS adapt transistor and said MOS read transistor are N-channel transistors.

5. An array of adaptive amplifiers arranged in a matrix of rows and columns, including:
   at least one row and at least one column of adaptive amplifiers, each of said amplifiers including an input node, an inverter including a P-channel MOS inverter transistor and an N-channel MOS inverter transistor, said P-channel MOS inverter transistor having its source connected to an output current sense node, its drain connected to the drain of said N-channel MOS inverter transistor, and a gate connected to the gate of said N-channel MOS inverter transistor, the source of said N-channel MOS inverter transistor connected to a source of negative voltage, a capacitor connected between said input node and the gates of said P-channel and N-channel MOS inverter transistors, and an MOS adapt transistor, having its drain connected to the gates of said P-channel and N-channel inverter transistors, its source connected to the drains of said P-channel and N-channel inverter transistors, and its gate connected to an adapt node,
   an input line associated with each row in said array, said input line for each row connected to the input nodes of all of the adaptive amplifiers in that row,
   a write line associated with each column in said array, said write line for each row connected to the adapt nodes of all of the adaptive amplifiers in that column, and
   an output current sense line associated with each column in said array, said output current sense line for each row connected to the output current sense nodes of all of the adaptive amplifiers in that column.

6. An array of adaptive amplifiers arranged in a matrix of rows and columns, including:
   at least one row and at least one column of adaptive amplifiers, each of said amplifiers including an input/output node, an inverter including a P-channel MOS inverter transistor and an N-channel MOS inverter transistor, said P-channel MOS inverter transistor having its source connected to an output current sense node, its drain connected to the drain of said N-channel MOS inverter transistor, and a gate connected to the gate of said N-channel MOS inverter transistor, the source of said N-channel MOS inverter transistor connected to a source of negative voltage, a capacitor connected between said input/output node and the gates of said P-channel and N-channel MOS inverter transistors, an MOS adapt transistor, having its drain connected to the gates of said P-channel and N-channel inverter transistors, its source connected to the drains of said P-channel and N-channel inverter transistors, and its gate connected to an adapt node, and an MOS read transistor, having its drain connected to the drains of said P-channel and N-channel inverter transistors, its source connected to said input/output node, and its gate connected to a read node, an input line associated with each row in said array, said input line for each row connected to the input-/output nodes of all of the adaptive amplifiers in that row, a write line associated with each column in said array, said write line for each row connected to the adapt nodes of all of the adaptive amplifiers in that column, an output current sense line associated with each column in said array, said output current sense line for each row connected to the output current sense nodes of all of the adaptive amplifiers in that column, and a read line associated with each column in said array, said read line for each row connected to the output nodes of all of the adaptive amplifiers in that column.

7. An array of adaptive amplifiers arranged in a matrix of rows and columns, including:

at least one row and at least one column of adaptive amplifiers, each of said amplifiers including an input node, an inverter including a P-channel MOS inverter transistor and an N-channel MOS inverter transistor, said P-channel MOS inverter transistor having its source connected to an output current sense node, its drain connected to the drain of said N-channel MOS inverter transistor, and a gate connected to the gate of said N-channel MOS inverter transistor, the source of said N-channel MOS inverter transistor connected to a source of negative voltage, a capacitor connected between said input node and the gates of said P-channel and N-channel MOS inverter transistors, and an MOS adapt transistor, having its drain connected to the gates of said P-channel and N-channel inverter transistors, its source connected to the drains of said P-channel and N-channel inverter transistors, and its gate connected to an adapt node, an input line associated with each row in said array, said input line for each row connected to the input nodes of all of the adaptive amplifiers in that row, a write line associated with each column in said array, said write line for each row connected to the adapt nodes of all of the adaptive amplifiers in that column, an output current sense line associated with each column in said array, said output current sense line for each row connected to the output current sense nodes of all of the adaptive amplifiers in that column, a dummy adaptive amplifier associated with each row of said array, each dummy adaptive amplifier including an input node, an inverter including a P-channel MOS inverter transistor and an N-channel MOS inverter transistor, said P-channel MOS inverter transistor having its source connected to an output current sense node, its drain connected to the drain of said N-channel MOS inverter transistor, and a gate connected to the gate of said N-channel MOS inverter transistor, the source of said N-channel MOS inverter transistor connected to a source of negative voltage, a capacitor connected between said input node and the gates of said P-channel and N-channel MOS inverter transistors, and an MOS adapt transistor, having its drain connected to the gates of said P-channel and N-channel inverter transistors, its source connected to the drains of said P-channel and N-channel inverter transistors, and its gate connected to an adapt node, a first switchable amplifier having a non-inverting input connected to its output, an inverting input connected to the input node of said dummy adaptable amplifier, and a switch node, and a second switchable amplifier having a non-inverting input connected to its output, an inverting input connected to the gates of the P-channel and N-channel inverter transistors and a switch node.

8. An array of adaptive amplifiers arranged in a matrix of rows and columns, including:

at least one row and at least one column of adaptive amplifiers, each of said amplifiers including an input/output node, an inverter including a P-channel MOS inverter transistor and an N-channel MOS inverter transistor, said P-channel MOS inverter transistor having its source connected to an output current sense node, its drain connected to the drain of said N-channel MOS inverter transistor, and a gate connected to the gate of said N-channel MOS inverter transistor, the source of said N-channel MOS inverter transistor connected to a source of negative voltage, a capacitor connected between said input/output node and the gates of said P-channel and N-channel MOS inverter transistors, an MOS adapt transistor, having its drain connected to the gates of said P-channel and N-channel inverter transistors, its source connected to the drains of said P-channel and N-channel inverter transistors, and its gate connected to an adapt node, and an MOS read transistor, having its drain connected to the drains of said P-channel and N-channel inverter transistors, its source connected to said input/output node, and its gate connected to a read node, an input line associated with each row in said array, said input line for each row connected to the input-/output nodes of all of the adaptive amplifiers in that row, a write line associated with each column in said array, said write line for each row connected to the adapt nodes of all of the adaptive amplifiers in that column, an output current sense line associated with each column in said array, said output current sense line for each row connected to the output current sense nodes of all of the adaptive amplifiers in that column, a read line associated with each column in said array, said read line for each row connected to the output nodes of all of the adaptive amplifiers in that column, a dummy adaptive amplifier associated with each row of said array, each dummy adaptive amplifier including an input node, an inverter including a P-channel MOS inverter transistor and an N-channel MOS inverter transistor, said P-channel MOS inverter transistor having its source connected to an output current sense node, its drain connected to the drain of said N-channel MOS inverter transistor, and a gate connected to the gate of said N-channel MOS inverter transistor, the source of said N-channel MOS inverter transistor connected to a source of negative voltage, a capacitor connected between said input node and the gates of said P-channel and N-channel MOS inverter transistors, and an MOS adapt transistor, having its drain connected to the gates of said P-channel and N-channel inverter transistors, its source connected to the drains of said P-channel and N-channel inverter transistors, and its gate connected to an adapt node,
- a first switchable amplifier having a non-inverting input connected to its output, an inverting input connected to the input node of said dummy adaptable amplifier, and a switch node, and
- a second switchable amplifier having a non-inverting input connected to its output, an inverting input connected to the gates of the P-channel and N-channel inverter transistors, and a switch node.

9. An adaptive amplifier, including:
an input node,
- an inverter including a P-channel MOS inverter transistor and an N-channel MOS inverter transistor, said P-channel MOS inverter transistor having its source connected to a source of positive voltage, its drain connected to the drain of said N-channel MOS inverter transistor, and a gate connected to the gate of said N-channel MOS inverter transistor, the source of said N-channel MOS inverter transistor connected to an output current sense node,
- a capacitor connected between said input node and the gates of said P-channel and N-channel MOS inverter transistors, and
- an MOS adapt transistor, having its drain connected to the gates of said P-channel and N-channel inverter transistors, its source connected to the drains of said P-channel and N-channel inverter transistors, and its gate connected to an adapt node.

10. The adaptive amplifier of claim 9 wherein said MOS adapt transistor is an N-channel MOS transistor.

11. An adaptive amplifier, including:
an input/output node,
- an inverter including a P-channel MOS inverter transistor and an N-channel MOS inverter transistor, said P-channel MOS inverter transistor having its source connected to a source of positive voltage, its drain connected to the drain of said N-channel MOS inverter transistor, and a gate connected to the gate of said N-channel MOS inverter transistor, the source of said N-channel MOS inverter transistor connected to an output current sense node,
- a capacitor connected between said input/output node and the gates of said P-channel and N-channel MOS inverter transistors,
- an MOS adapt transistor, having its drain connected to the gates of said P-channel and N-channel inverter transistors, its source connected to the drains of said P-channel and N-channel inverter transistors, and its gate connected to an adapt node, and
- a MOS read transistor, having its drain connected to the drains of said P-channel and N-channel inverter transistors, its source connected to said input/output node, and its gate connected to a read node.

12. The adaptive amplifier of claim 11 wherein said MOS adapt transistor and said MOS read transistor are N-channel transistors.

13. An array of adaptive amplifiers arranged in a matrix of rows and columns, including:
- at least one row and at least one column of adaptive amplifiers, each of said amplifiers including an input node, an inverter including a P-channel MOS inverter transistor and an N-channel MOS inverter transistor, said P-channel MOS inverter transistor having its source connected to a source of positive voltage, its drain connected to the drain of said N-channel MOS inverter transistor, and a gate connected to the gate of said N-channel MOS inverter transistor, the source of said N-channel MOS inverter transistor connected to an output current sense node, a capacitor connected between said input node and the gates of said P-channel and N-channel MOS inverter transistors, and an MOS adapt transistor, having its drain connected to the gates of said P-channel and N-channel inverter transistors, its source connected to the drains of said P-channel and N-channel inverter transistors, and its gate connected to an adapt node,
- an input line associated with each row in said array, said input line for each row connected to the input nodes of all of the adaptive amplifiers in that row,
- a write line associated with each column in said array, said write line for each row connected to the adapt nodes of all of the adaptive amplifiers in that column, and
- an output current sense line associated with each column in said array, said output current sense line for each row connected to the output current sense nodes of all of the adaptive amplifiers in that column.

14. An array of adaptive amplifiers arranged in a matrix of rows and columns, including:
- at least one row and at least one column of adaptive amplifiers, each of said amplifiers including an input/output node, an inverter including a P-channel MOS inverter transistor and an N-channel MOS inverter transistor, said P-channel MOS inverter transistor having its source connected to a source of positive voltage, its drain connected to the drain of said N-channel MOS inverter transistor, and a gate connected to the gate of said N-channel MOS inverter transistor, the source of said N-channel MOS inverter transistor connected to an output current sense node, a capacitor connected between said input/output node and the gates of said P-channel and N-channel MOS inverter transistors, an MOS adapt transistor, having its drain connected to the gates of said P-channel and N-channel inverter transistors, its source connected to the drains of said P-channel and N-channel inverter transistors, and its gate connected to an adapt node, and an MOS read transistor, having its drain connected to the drains of s id P-channel and N-channel inverter transistors, its source connected to said input/output node, and its gate connected to a read node,
- an input line associated with each row in said array, said input line for each row connected to the input/output nodes of all of the adaptive amplifiers in that row,
- a write line associated with each column in said array, said write line for each row connected to the adapt nodes of all of the adaptive amplifiers in that column,
- an output current sense line associated with each column in said array, said output current sense line for each row connected to the output current sense nodes of all of the adaptive amplifiers in that column, and
- a read line associated with each column in said array, said read line for each row connected to the output nodes of all of the adaptive amplifiers in that column.

15. An array of adaptive amplifiers arranged in a matrix of rows and columns, including:
- at least one row and at least one column of adaptive amplifiers, each of said amplifiers including an input node, an inverter including a P-channel MOS inverter transistor and an N-channel MOS inverter transistor, said P-channel MOS inverter transistor having its source connected to a source of positive voltage, its drain connected to the drain of said N-channel MOS inverter transistor, and a gate connected to the gate of said N-channel MOS inverter transistor, the source of said N-channel MOS inverter transistor connected to an output current sense node, a capacitor connected between said input node and the gates of said P-channel and N-channel MOS inverter transistors, and an MOS adapt transistor, having its drain connected to the gates of said P-channel and N-channel inverter transistors, its source connected to the drains of said P-channel and N-channel inverter transistors, and its gate connected to an adapt node,
- an input line associated with each row in said array, said input line for each row connected to the input nodes of all of the adaptive amplifiers in that row,
- a write line associated with each column in said array, said write line for each row connected to the adapt nodes of all of the adaptive amplifiers in that column,
- an output current sense line associated with each column in said array, said output current sense line for each row connected to the output current sense nodes of all of the adaptive amplifiers in that column,
- a dummy adaptive amplifier associated with each row of said array, each dummy adaptive amplifier including an input node, an inverter including a P-channel MOS inverter transistor and an N-channel MOS inverter transistor, said P-channel MOS inverter transistor having its source connected to a source of positive voltage, its drain connected to the drain of said N-channel MOS inverter transistor, and a gate connected to the gate of said N-channel MOS inverter transistor, the source of said N-channel MOS inverter transistor connected to an output current sense node, a capacitor connected between said input node and the gates of said P-channel and N-channel MOS inverter transistors, and an MOS adapt transistor, having its drain connected to the gates of said P-channel and N-channel inverter transistors, its source connected to the drains of said P-channel and N-channel inverter transistors, and its gate connected to an adapt node,
- a first switchable amplifier having a non-inverting input connected to its output, an inverting input connected to the input node of said dummy adaptable amplifier, and a switch node, and
- a second switchable amplifier having a non-inverting input connected to its output, an inverting input connected to the gates of the P-channel and N-channel inverter transistors, and a switch node.

16. An array of adaptive amplifiers arranged in a matrix of rows and columns, including:
- at least one row and at least one column of adaptive amplifiers, each of said amplifiers including an input/output node, an inverter including a P-channel MOS inverter transistor and an N-channel MOS inverter transistor, said P-channel MOS inverter transistor having its source connected to a source of positive voltage, its drain connected to the drain of said N-channel MOS inverter transistor, and a gate connected to the gate of said N-channel MOS inverter transistor, the source of said N-channel MOS inverter transistor connected to an output current sense node, a capacitor connected between said input/output node and the gates of said P-channel and N-channel MOS inverter transistors, an MOS adapt transistor, having its drain connected to the gates of said P-channel and N-channel inverter transistors, its source connected to the drains of said P-channel and N-channel inverter transistors, and its gate connected to an adapt node, and an MOS read transistor, having its drain connected to the drains of said P-channel and N-channel inverter transistors, its source connected to said input/output node, and its gate connected to a read node,
- an input line associated with each row in said array, said input line for each row connected to the input/output nodes of all of the adaptive amplifiers in that row,
- a write line associated with each column in said array, said write line for each row connected to the adapt nodes of all of the adaptive amplifiers in that column,
- an output current sense line associated with each column in said array, said output current sense line for each row connected to the output current sense nodes of all of the adaptive amplifiers in that column,
- a read line associated with each column in said array, said read line for each row connected to the output nodes of all of the adaptive amplifiers in that column,
- a dummy adaptive amplifier associated with each row of said array, each dummy adaptive amplifier including an input node, an inverter including a P-channel MOS inverter transistor and an N-channel MOS inverter transistor, said P-channel MOS inverter transistor having its source connected to a source of positive voltage, its drain connected to the drain of said N-channel MOS inverter transistor, and a gate connected to the gate of said N-channel MOS inverter transistor, the source of said N-channel MOS inverter transistor connected to an output current sense node, a capacitor connected between said input node and the gates of said P-channel and N-channel MOS inverter transistors, and an MOS adapt transistor, having its drain connected to the gates of said P-channel and N-channel inverter transistors, its source connected to the drains of said P-channel and N-channel inverter transistors, and its gate connected to an adapt node,
- a first switchable amplifier having a non-inverting input connected to its output, an inverting input connected to the input node of said dummy adaptable amplifier, and a switch node, and
- a second switchable amplifier having a non-inverting input connected to its output, an inverting input connected to the gates of the P-channel and N-channel inverter transistors, and a switch node.

* * * * *

REEXAMINATION CERTIFICATE (1793rd)

United States Patent [19]

Mead et al.

[11] B1 4,962,342

[45] Certificate Issued  Sep. 15, 1992

[54] DYNAMIC SYNASE FOR NEURAL NETWORK

[75] Inventors: Carver A. Mead, Pasadena; Timothy P. Allen, Palo Alto; Federico Faggin, Los Altos Hills, all of Calif.

[73] Assignee: Synaptics Inc., San Jose, Calif.

Reexamination Request:
No. 90/002,584, Feb. 11, 1992

Reexamination Certificate for:
Patent No.: 4,962,342
Issued: Oct. 9, 1990
Appl. No.: 347,837
Filed: May 4, 1989

[51] Int. Cl.[5] .................. G11C 27/02; G11C 7/00; H03K 19/094; H03K 19/177
[52] U.S. Cl. .................. 307/201; 307/493; 307/469; 307/530; 365/189.04; 365/189.05; 365/220
[58] Field of Search ......... 307/201, 493, 201, 530, 307/490, 496, 451, 469

[56] References Cited

U.S. PATENT DOCUMENTS

| | | | |
|---|---|---|---|
| 4,719,596 | 1/1988 | Bernstein et al. | 365/189 |
| 4,771,196 | 9/1988 | Mead et al. | 307/605 |
| 4,831,591 | 5/1989 | Imazeki et al. | 365/189 |
| 4,904,881 | 2/1990 | Castro | 307/201 |
| 4,904,888 | 2/1990 | Yamauchi et al. | 307/530 |
| 4,906,865 | 3/1990 | Holler | 307/353 |

Primary Examiner—John S. Heyman

[57] ABSTRACT

An electronic circuit is disclosed having a sample/hold amplifier connected to an adaptive amplifer. A plurality of such electronic circuits may be configured in an array of rows and columns. An input voltage vector may be compared with an analog voltage vector stored in a row or column of the array and the stored vector closest to the applied input vector may be identified and further processed. The stored analog value may be read out of the synapse by applying a voltage to a read line. An array of the readable synapses may be provided and used in conjunction with a dummy synapse to compensate for an error offset introduced by the operating characteristics of the synapses.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-6 is confirmed.

* * * * *